United States Patent [19]

Shimada

[11] Patent Number: 5,740,272
[45] Date of Patent: Apr. 14, 1998

[54] INSPECTION APPARATUS OF WIRING BOARD

[75] Inventor: Yoshinori Shimada, Yamatokoriya, Japan

[73] Assignee: Sharp Kabushiki Kaisha, Osaka, Japan

[21] Appl. No.: 606,344

[22] Filed: Feb. 23, 1996

[30] Foreign Application Priority Data

Feb. 27, 1995 [JP] Japan ................... 7-038763

[51] Int. Cl.$^6$ .......................... G01R 31/02; G01J 5/10
[52] U.S. Cl. ............................ 382/149; 324/770
[58] Field of Search ............................ 374/4; 382/145, 382/147, 148, 149, 150, 173; 348/126, 87, 164; 250/332, 341.4, 341.6, 559.45, 559.34, 559.08, 559.05, 342; 437/8; 364/468.17, 468.28, 557; 356/237, 51, 390; 324/770, 501; 345/38, 50, 92, 93, 87, 904

[56] References Cited

U.S. PATENT DOCUMENTS

| | | | |
|---|---|---|---|
| 3,868,508 | 2/1975 | Lloyd ................... | 250/330 |
| 3,991,302 | 11/1976 | Danner ................... | 364/481 |
| 4,771,468 | 9/1988 | Batchelder et al. ................... | 382/149 |
| 5,309,108 | 5/1994 | Maeda et al. ................... | 324/501 |
| 5,396,068 | 3/1995 | Betha ................... | 250/330 |
| 5,576,730 | 11/1996 | Shimada et al. ................... | 345/98 |

FOREIGN PATENT DOCUMENTS

5-126544  5/1993  Japan.

*Primary Examiner*—Leo Boudreau
*Assistant Examiner*—Brian P. Werner
*Attorney, Agent, or Firm*—Nixon & Vanderhye P.C.

[57] ABSTRACT

An object of the invention is to shorten the inspection time of wiring board. A high frequency signal is applied to source signal wiring of a substrate member 12 put on a table 13 from signal feeding means 17 through terminals of a frame 14. A signal of which voltage absolute value is greater than the voltage amplitude of the high frequency signal and voltage polarity is positive is applied to a scanning wiring of the substrate member 12. An infrared image of the substrate member 12 with signal applied is taken by image pickup means 15. In image processing means 16, from the image data fed from the image pickup means 15, an infrared image changing in contrast depending on the emission of infrared rays is formed, and the infrared image is divided into plural regions equal in the size of wiring pattern. In control means 18, the image of each divided region is compared with images of plural adjacent regions, and difference is detected. When a difference is detected, it is judged there is a defect in that region.

9 Claims, 9 Drawing Sheets

INSPECTION APPARATUS OF WIRING BOARD

BACKGROUND OF THE INVENTION

1. Field of the Invention

The present invention relates to a wiring board inspection apparatus, preferably applied to inspection of defects of wirings of a wiring board, in which an identical wiring pattern is repealed, such as a wiring substrate of an active matrix type used in a liquid crystal display apparatus.

2. Description of the Related Art

In a liquid crystal display apparatus for matrix display capable of displaying arbitrary characters and graphic patterns is interposed a liquid crystal layer as a display medium of plural pixels arrayed in a matrix form, between a pair of substrate members provided with plural pixel electrodes and counter electrodes facing the pixel electrodes.

As a driving method of such display apparatus, the active matrix driving method is known. In this driving method, the pixel electrodes are composed of independent electrodes for each pixel and provided with switching elements individually, which are controlled to control the pixels independently. The switching elements are connected between the pixel electrodes and the wirings for transmitting signals applied to the pixel electrodes, and signal supply is turned on or off individually in each pixel. The display apparatus of the active matrix driving method is characterized by displaying with higher contrast as compared with display apparatuses of other driving method. Switching elements are realized by either three-terminal elements such as thin film transistors (TFT) or two-terminal elements.

In the liquid crystal display apparatus, an image pattern is formed on a display screen by changing over the states of the plural pixels arrayed in a matrix form, for example, from white into black display or vice versa, corresponding to presence or absence of light emitted from the display surface. The white or black display of each pixel on the display screen is changed over in such a manner that the magnitude of a voltage applied to the electrodes is varied to change the state of the display medium held between the electrodes and as a consequence change the optical properties of the display medium, for example, in the case of liquid crystal, change over presence or absence of optical rotation and as a consequence vary the array state of liquid crystal molecules. The liquid crystal display apparatus employing such an active matrix driving method is used in liquid crystal televisions, word processors, display apparatuses of computer terminals etc.

The liquid crystal display apparatus comprises a pair of substrate members, one of which is an active matrix substrate member provided with plural wirings, pixel electrodes, switching elements and others and the other of which is a color filter substrate member provided with counter electrodes and color filters. The liquid crystal display apparatus is completed by gluing the two substrate members so as to leave an interval therebetween, thereafter injecting a liquid crystal material into the interval to form a liquid crystal layer, and then mounting peripheral circuit parts.

Thus, the manufacturing process of the liquid crystal display apparatus comprises a step of manufacturing each substrate member, a step of gluing a pair of substrate members, a step of injecting a liquid crystal material between the pair of substrate members, and a step of mounting peripheral circuit parts. Between the step of injecting a liquid crystal material and the step of mounting peripheral circuit parts, there lies an inspection step of inspecting display to check whether the liquid crystal display apparatus can display favorably or not.

In the step of manufacturing the active matrix substrate member, defects such as a disconnection or a short circuit of the wiring on the substrate member may be produced. Such defects cause defects in display of the liquid crystal display apparatus. To decrease failures such as defects in display of the liquid crystal display apparatus, it is necessary to detect defects of the active matrix substrate member before the step of injecting the liquid crystal material.

Figure 10:
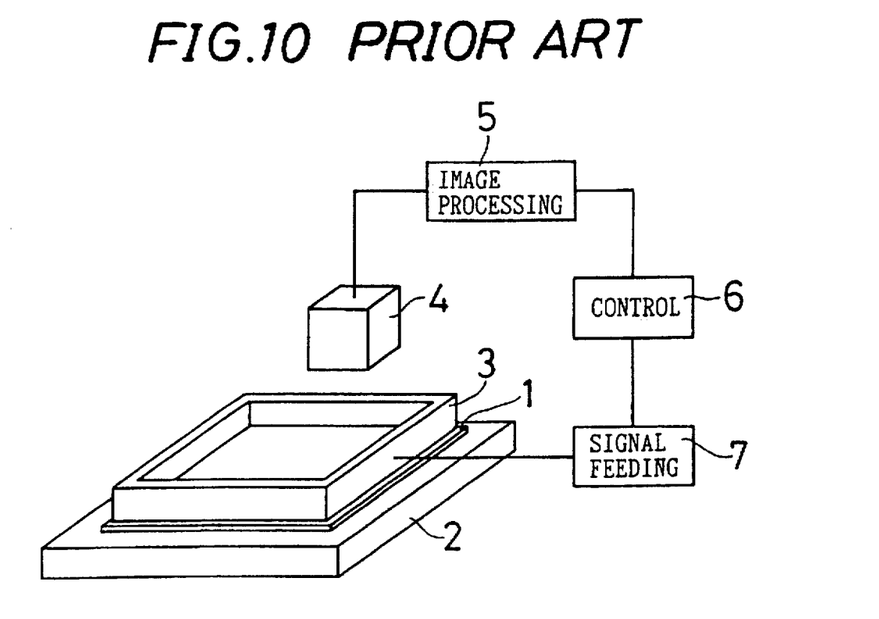
FIG. 10 is a simplified structural diagram of an apparatus for inspecting a wiring board of a first prior art.

FIG. 10 is a simplified structural diagram of an active matrix substrate member inspection apparatus of a first prior art. A substrate member 1 to be inspected is put on a table 2 and then a frame 3 is put on the substrate member 1. In the bottom of the frame 3 (the surface contacting with the substrate member 1) are provided plural terminals of signal feeding means 7, which are electrically connected to plural wiring terminals disposed around the substrate member 1 by pressing the frame 3 against the substrate member 1. Thereby an inspection signal is applied to each wiring of the substrate member 1 from the signal feeding means 7. Above the table 2 is arranged a camera 4 for forming an infrared image by detecting infrared rays radiated from the surface of the substrate member 1. The image picked up by the camera 4 is processed by image processing means 5, for example, into a monochromatic image depending on the radiant amount of the infrared rays, and is given to control means 6.

Figure 11A:
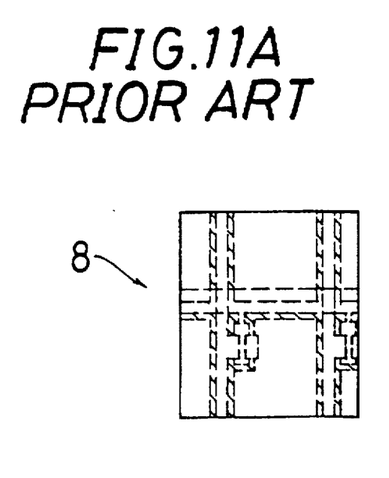
FIGS. 11A and 11B are diagrams showing an infrared image of a substrate member 1 processed by image processing means 5 in FIG. 10, FIG. 11A being a diagram showing an infrared image of an active matrix substrate member, picked up under the state that an inspection signal is not applied to the wirings, FIG. 11B being a diagram showing an infrared image of an active matrix substrate member, picked up under the state that a voltage is applied to the wirings.
Figure 11B:
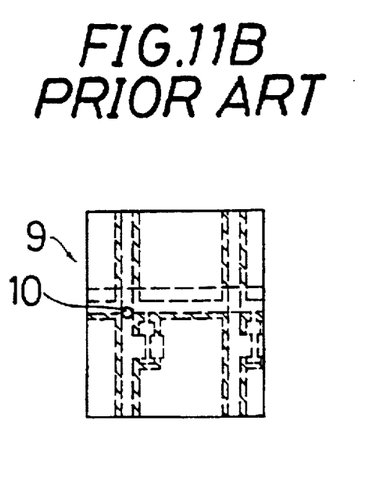

The camera 4 first picks up the image of the wiring pattern of the substrate member 1 under the state that an inspection signal is not applied to the wirings of the substrate member 1. The image indicated by reference numeral 8 in FIG. 11A is an infrared ray image of the active matrix substrate member, taken under the state that an inspection signal is not applied to the wirings of the substrate member 1. Successively, by applying an inspection signal to each wiring of the substrate member 1, an image of the wiring pattern of the substrate member 1 is taken under this state. A drive signal of the liquid crystal display apparatus, for example, is used as the inspection signal. The image indicated by reference numeral 9 in FIG. 11B is an infrared ray image of the active matrix substrate member, which is taken under the state that a voltage is applied to the wirings. The images 8 and 9 are ones of the same region. The infrared radiation amounts in the shaded areas of the images 8 and 9 are less than that in the white area (not shaded), and the images in the shaded area look dark, which show different contrast areas.

At this time, if there is a defect in the substrate member 1, such as a disconnection or a short circuit of wirings and a malfunction of switching elements, the current is concentrated in the defective area to generate Joule heat, and the radiated infrared rays become intense. Comparing the image 8 taken under the state of no signal application with the image 9 taken under the state of signal application, it is found that the image 9 includes a portion 10 emitting intense infrared rays, which is not seen in the image 8. Therefore, by comparing the image 8 and image 9 and detecting the difference therebetween in image pattern, defects in the active matrix substrate member can be detected.

As mentioned above, in the process of manufacturing a liquid crystal display apparatus, to reduce the cost by preventing production and shipment of defective products having display defects or the like, it is desired to detect defects of the active matrix substrate member which is one of the causes of failure before forming the liquid crystal layer, for example, in the process of manufacturing the substrate member. It is hence demanded to develop an inspection apparatus capable of easily inspecting in the process of manufacturing the substrate member.

In the inspection apparatus of the first prior art, in order to inspect the one substrate member, it is needed to take at least two images, that is, one under the state that an inspection signal is applied to the wirings on the substrate, and the other under the state that an inspection signal is not applied to the wirings. Accordingly, the inspection time becomes longer.

A defect is detected by comparing the patterns of the images under the state of signal application and under the state of no signal application. In a portion having a relatively severe defect such as a short circuit, an extreme current concentration occurs when the signal is applied, and the infrared radiation of the portion baring a defect is more intense in comparison with the case where the portion has no defect. Therefore, under the state of signal application, the difference in gradation between the image in the defective area and the image in the surrounding area is larger, as compared with that under the state of no signal application. Hence, the defect can be easily detected.

In a smaller defective area, which causes only a slight current concentration when the signal is applied, the radiant amount of infrared rays after signal application is not so different from the radiant amount of infrared rays before signal application. Under the state of no signal application, since the radiant amount of infrared rays increases or decreases in the defective area as compared with the surrounding intact area, the image taken before signal application is one taken under the state that there is a gradation difference between the defective area and the surrounding area. Under the state of signal application, on the other hand, since the current concentration is slight, the gradation difference between the defective area and the surrounding area under the state of signal application is not so different from that before signal application. Accordingly, when the degree of a defect is small, even if the two images are compared, both images have a difference in gradation between the defective area and the surrounding area, the current concentration is slight, and there is no notable difference in gradation in the corresponding regions of the two images, and hence it is difficult to detect the defect. Therefore, the sensitivity is not sufficient for tiny defects of the substrate member, and the precision of defect detection is lowered.

Figure 12:
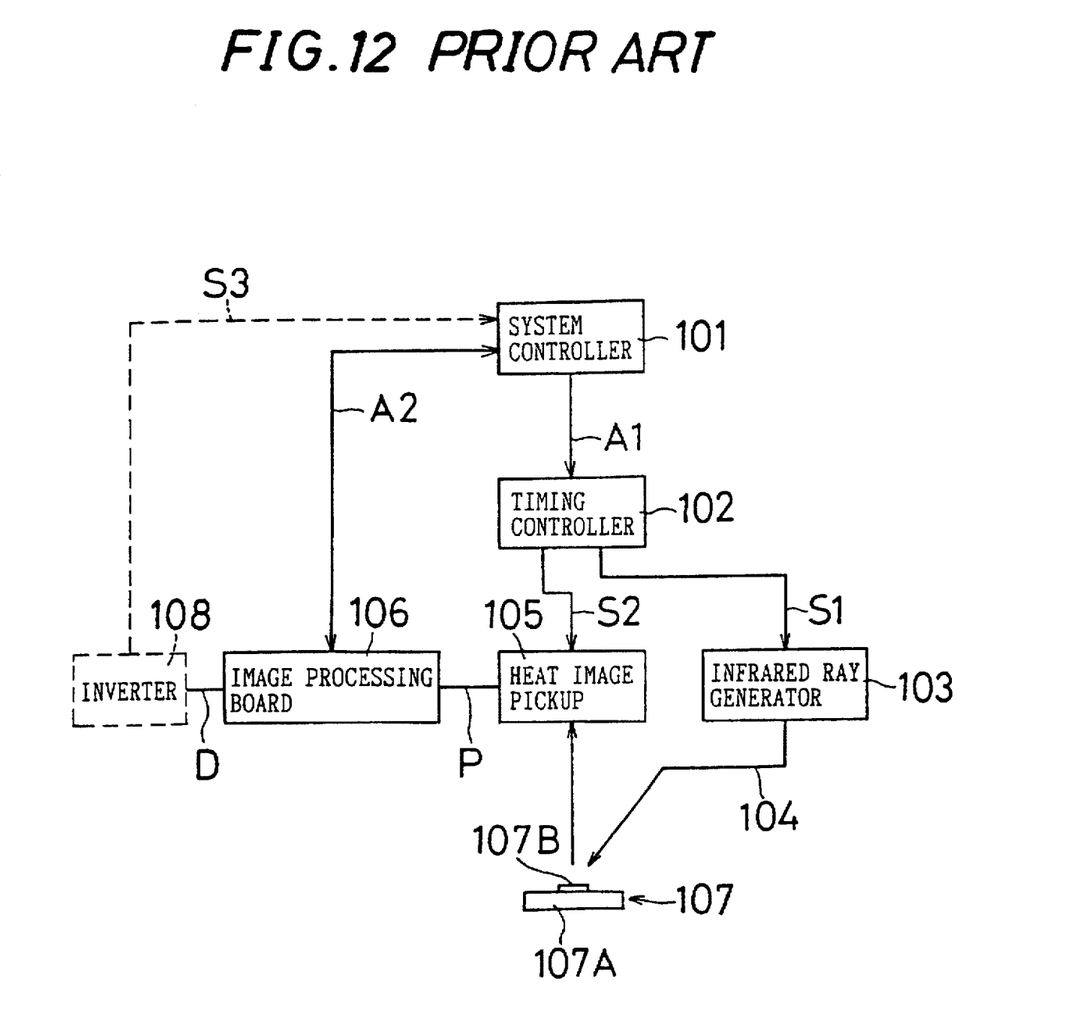
FIG. 12 is a block diagram showing the constitution of an apparatus for inspecting a printed wiring board of a second prior art.

An inspection apparatus of printed wiring board is disclosed in Japanese Unexamined Patent Publication JPA5-126544 (1993) as a second prior art. This printed wiring board inspection apparatus is an apparatus for judging whether a printed wiring board is acceptable or not by irradiating infrared rays to the printing wiring board, picking up a heat image, and processing the heat image. FIG. 12 is a block diagram showing the constitution of the printed wiring board inspection apparatus of the second prior art.

In the printed wiring board inspection apparatus, on a pickup instruction A1 from a system controller 101, a timing controller 102 outputs an irradiation signal S1 to an infrared ray generator 103, and a pickup signal S2 to a heat image pick up part 105. The infrared ray generator 103 emits infrared rays 104 to a printed wiring board 107 on the irradiation signal S1. The heat image pickup part 105 takes an image of the printed wiring board 107 irradiated with the infrared rays 104 on the pickup signal S2, and outputs the picked-up heat image P to an image processing board 106.

The image processing board 106 forms image data D on the basis of the heat image P, and compares with specific inspection data, and judges whether the printed wiring board 107 is acceptable or not.

Figure 13:
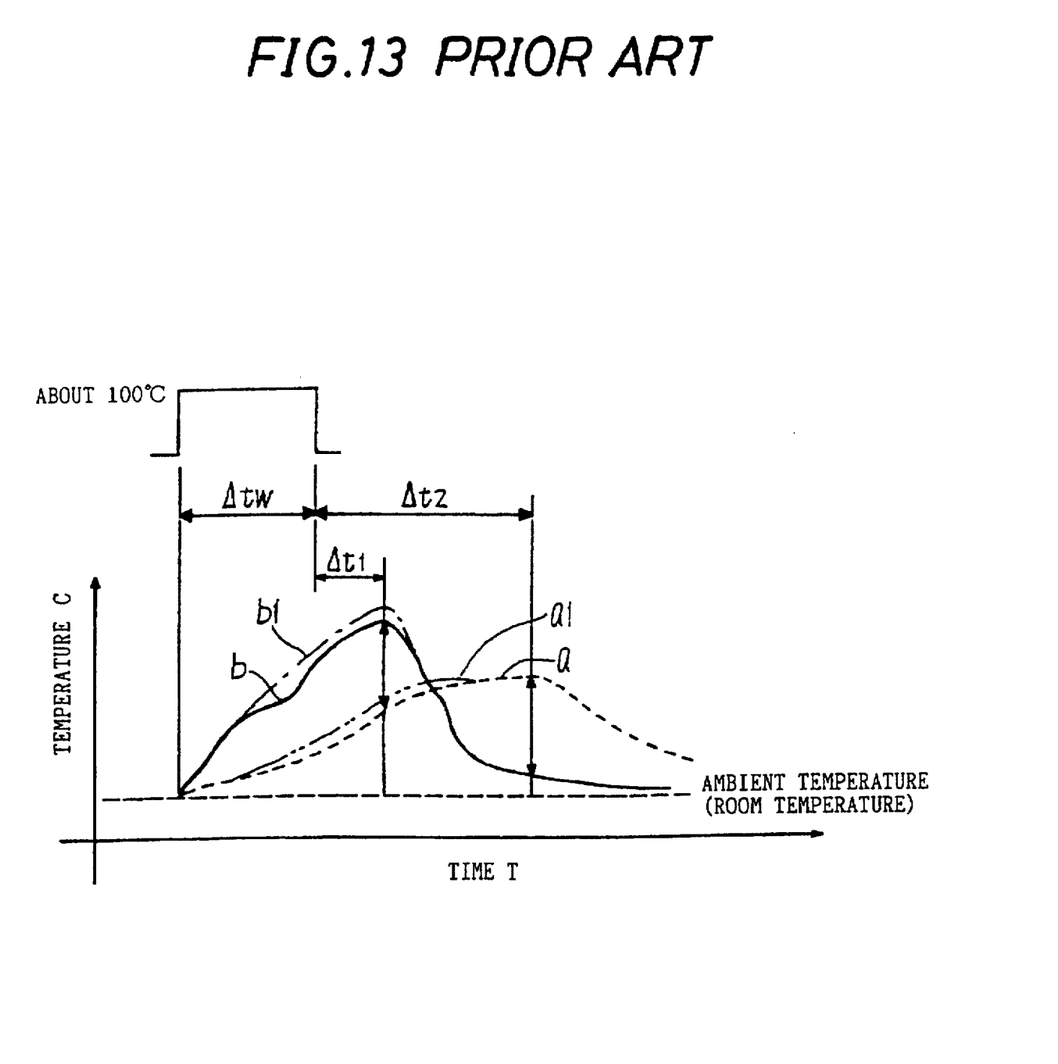
FIG. 13 is a chart showing a pickup timing and temperature changes of a printed wiring board 107 under and after irradiation of infrared rays 104.

FIG. 13 is a chart showing a pickup timing and the temperature changes of the printed wiring board 107 in irradiation of the infrared rays 104. In FIG. 13, the axis of ordinates denotes temperature C and the axis of abscissas denotes time T. When the printed wiring board is heated with heat pulses of 100° C. for time $\Delta tw$ through irradiation of infrared rays 104, a substrate 107A composing the printed wiring board 107 undergoes a relatively moderate temperature change as indicated by dotted line curve a, while a patterned wiring 107B provided in the substrate 107A suffers a sharper temperature change than the substrate 107A as indicated by a continuous line curve b.

An alternate long and short dash line b1 is a curve showing a temperature changes when there is a foreign matter deposited on the patterned wiring 107B, and an alternate long and two short dashes line a1 is a curve showing temperature changes when there is a foreign matter deposited on the substrate 107A. As shown in FIG. 13, when a foreign matter deposits, the temperature rise becomes steeper than when there is no foreign matter, so that deposit of foreign matter is detected. If there is a flaw in the patterned wiring 107B, the temperature does not rise in the flaw area, so that the flaw can be detected.

Picking up of the heat image of the printed wiring board 107 by the heat image pickup part 105 is conducted twice, namely a lapse of time $\Delta t1$ and a lapse of time $\Delta t2$ after the end of heating. In the case of the pickup of the timing of the lapse of time $\Delta t1$, flaws and deposits of foreign matters can be clearly detected, but the possible pickup time band is very narrow, and fine timing setting is needed, whereas in the case of the pickup of the timing of the lapse of time $\Delta t2$, although flaws and deposits of foreign matters cannot be detected clearly, the possible pickup time band is broad, and timing setting is easy and secure.

The two picked-up heat images P are put into the image processing board 106, and respectively converted into image data D. The temperature of the patterned wiring 107B after the lapse of time $\Delta t1$ is higher than that of the substrate 107A, and the temperature of the patterned wiring 107B after the lapse of time $\Delta t2$ is lower than that of the substrate 107A. Therefore, the temperature relation between the patterned wiring 107B and the substrate 107A after the lapse of time $\Delta t2$ is nearly the same as the temperature relation between the patterned wiring 107B and the substrate 107A after the lapse of time $\Delta t1$, if only the high-low relation is inverted, and therefore the contrasts of two image data sets D of the two heat images are mutually inverted. Accordingly, if there is no notable difference between the two image data sets D of the two heat images when the contrast of either one of the two image data sets D is inverted for comparison between the two image data sets, defect detection is carried out using the image data sets. When the two image data sets D are notably different in the comparison, a retry signal D3 is issued from an inverting unit 108 into the system controller 101, and the timing of time $\Delta t1$ is newly adjusted, and the images are picked up again.

In this way, in the inspection apparatus of the second prior art, although two images are picked up, since a defect is detected by using the specific inspection data in inspection, a tiny defect in the substrate member which was difficult to be detected by the inspection apparatus of the first prior art can be accurately detected.

However, the same as in the first prior art, at least two heat images must be picked up after irradiation of infrared rays in order to inspect one substrate member. Furthermore, if two image data sets are largely different in comparison of the two image data sets corresponding to the two heat images, it is necessary to pick up two heat images again. Hence, the inspection time is long.

Moreover, detection of a defect requires at least two processes, one of which is comparison of two image data sets corresponding to two images, and the other of which is comparison between specific inspection data and image data. As a result, a longer inspection time is needed, and the constitution for two processes is complicated, and the apparatus becomes larger in size.

SUMMARY OF THE INVENTION

It is hence a primary object of the invention to provide a wiring board inspection apparatus capable of shortening the inspection time and raising the precision of defect detection.

To achieve the object, the invention provides an inspection apparatus for a wiring board including wirings formed by repeating an identical pattern, the apparatus comprising:

a table on which a wiring board is to be put;

signal feeding means for feeding an inspection signal to each wiring of the wiring board;

imaging means for picking up an infrared image of the wiring board put on the table, the imaging means being disposed above the table;

image processing means for responding to an output of the imaging means and dividing the picked-up infrared image into regions of a predetermined size;

detection means for responding to an output of the image processing means, comparing an infrared image of an arbitrary region of the divided regions with infrared images of plural adjacent regions, and detecting a difference therebetween; and judging means for responding to an output of the detection means and judging whether a defect is present in the arbitrary region.

In the invention, the wiring board comprises:

plural scanning wirings disposed parallel to each other at intervals on an insulating substrate;

plural signal wirings disposed at intervals orthogonally to the scanning wirings;

pixel electrodes disposed in rectangular pixel regions formed by intersection of the scanning wirings and signal wirings; and switching elements disposed in the pixel electrodes for connecting the wirings with pixel electrodes.

In the invention, the signal feeding means provides the signal wirings with a signal of which the voltage polarity is inverted in a longer cycle than a time constant of the product of the parasitic capacity and the resistance of the signal wirings, and provides the scanning wirings with a signal of which the voltage polarity is always positive, and of which the voltage absolute value is larger than the voltage amplitude of the signal fed to the signal wirings.

In the invention, the wiring board comprises common signal wirings disposed parallel to the scanning wirings, and auxiliary capacity electrodes disposed on the common signal wirings through an insulating layer, and connected to the pixel electrodes respectively, and the signal feeding means provides the signal wirings with a signal of which the voltage polarity is inverted in a longer cycle than a time constant of the product of the parasitic capacity and the resistance of the signal wirings, provides the scanning wirings with a signal of which the voltage absolute value is larger than the voltage amplitude of the signal fed to the signal wirings, and of which the voltage polarity is always positive, and provides the common signal wirings with a signal of which the voltage absolute value is larger than the voltage amplitude of the signal fed to the signal wirings, and of which the voltage polarity is always negative.

In the invention, the image processing means defines each region of a predetermined size as a rectangular region including at least one pixel electrode, and divides the picked-up infrared image so that the rectangular regions may be arranged in a matrix form.

In the invention, the detection means responses to an output of the image processing means, compares the infrared image of each region with infrared images of plural adjacent regions, and detects differences among the infrared images of the respective regions, and the judging means responds to an output of the detection means, judges whether a defect is present or not in each region, counts the number of regions having a defect, compares the counted value with a predetermined threshold, and judges whether the wiring board is acceptable or not.

In the invention, the detection means responds to an output of the image processing means, extracts infrared images in units of an image group composed of infrared images of a predetermined number of regions, compares the infrared image of one reference region in each image group with the infrared images of the other regions in each image group, and detects a difference between the infrared images, and the judging means responds to an output of the detection means, judges whether a defect is present or not in each image group, counts the number of regions having a defect in each image group, adds all the counted values, compares the total of the counted values with a predetermined threshold, and judges whether the substrate member is acceptable or not.

According to the invention, the wiring board inspected by the inspection apparatus of the invention is a substrate member in which wirings are formed by repeating an identical pattern, such as an active matrix substrate member. The wiring board comprises plural scanning wirings arranged parallel to each other at intervals on an insulating substrate, and plural signal wirings disposed at intervals and arranged orthogonally to the scanning wirings, on an insulating substrate, and pixel electrodes are disposed in predetermined regions of intersections of the scanning wirings and the signal wirings. The pixel electrodes are connected to the scanning wirings and the signal wirings through switching elements.

The wiring board is put on a table, and an infrared image of the wiring board is picked up under the state that an inspection signal is applied to each wiring from the signal feeding means by the image pickup means installed above the table. The picked-up infrared images are divided into regions of a predetermined size by the image processing means. The infrared image of an arbitrary region of the divided regions is compared with infrared images of plural adjacent regions, and the difference in image contrast, and other different points between the images are detected by the detection means. If a difference between the images is found, it is judged that a defect is present in that arbitrary region.

As a result, the hitherto required infrared image of the wiring board under the state of no signal application is not needed. Therefore, picking up of infrared image is carried out only one time, and the pickup time can be shortened.

Moreover, the infrared image of the region including a wiring having a defect is compared with the infrared image of other regions including a defect-free wiring, and it is easy to detect a bright spot caused by slight current concentration or the like, and a tiny defect can be easily discovered.

According to the invention, the signal feeding means provides the signal wirings of the wiring board with a signal of, for example, high frequency, of which the voltage polarity is inverted in a longer cycle than the time constant of the signal wirings. As a result, much charging and discharging current flows into the wiring and pixel electrodes, and the radiation of the infrared rays radiated by current concentration formed in the defect area is increased. Depending on a tiny defect, moreover, the contrast of the infrared image changes largely. The scanning wirings are provided with a signal of which the voltage absolute value is larger than the voltage amplitude of the signal fed to the signal wirings and of which the voltage polarity is always positive. When the signals fed to the scanning wirings and the signal wirings are selected in this manner, multiple defects such as short circuit and disconnection of a wiring, and malfunction of switching elements can be clearly detected at the same time.

The wiring board further comprises common signal wirings disposed parallel to the scanning wirings, and auxiliary capacity electrodes disposed on the common signal wirings through an insulating layer, and connected to the pixel electrodes, respectively, and auxiliary capacities are formed between the common signal wirings and auxiliary capacity electrodes. In this case, the common signal wirings are provided with a signal of which the voltage absolute value is larger than the voltage amplitude of the signal fed to the signal wirings and of which the voltage polarity is always negative. As a result, defects of the wiring board including the common signal wirings can be detected clearly.

Also according to the invention, the image processing means divides the infrared image picked up by the image pickup means into rectangular regions in a matrix form. At least one pixel electrode is included in each rectangular region. For example, the picked up infrared image is divided into matrix of (m×n) rectangular regions. Therefore, plural adjacent regions necessary for judging whether a defect is present or not can be determined easily.

According to the invention, the detection means detects a difference by comparing the infrared image of one region of the divided regions with the infrared images of plural adjacent regions. Moreover, the detection means performs the same comparison operation on all divided infrared images, and outputs the result of detection to the judging means. The judging means judges whether a defect is present or not in all divided regions, according to the result of detection by the detection means, counts the number of regions having a defect, and judges that the wiring board is defective if the counting exceeds a predetermined threshold. Therefore, whether the wiring board is defective is judged by judging whether a defect is present in each one of the divided regions, so that the region having a defect can be detected accurately.

Also according to the invention, the detection means extracts a group of infrared images, which is composed of images of a predetermined number of regions, from among the infrared images of all the divided regions, determines a reference region in the image group, compares the infrared image of the reference region with the infrared images of the other regions, and detects a difference in image pattern individually. For example, of all the divided infrared images, nine images arranged in three rows by three columns are extracted as one image group, and the center region is selected as a reference, and is compared with the other eight surrounding images to detect a difference. The detection means also extracts an image group other than the extracted image group to detect similarly. Image groups are made so that each divided region may be included in any image group at least one time. The above-mentioned detection operation is conducted with respect to all the image groups and detection results are outputted to the judging means. The judging means judges whether a defect is present in each image group on the basis of the detection results, and counts the number of regions having a defect in each image region. The judging means also sums up the numbers of regions having a defect in the respective image groups, and judges that the wiring board is defective when the total exceeds a predetermined threshold.

Thus, according to the invention, in the apparatus for inspecting a defect of a wiring board, an infrared image is picked up under the state that an inspection signal is fed to each wiring of the board, the infrared image is divided into plural regions, the image of each region is compared with images of plural adjacent regions to detect a difference between the images, thereby judging whether a defect is present or not. Accordingly, it is only necessary to pick up an infrared image of the board under the state that the inspection signal is applied, and the image pickup time is shortened. Therefore, the inspection time can be notably shortened.

The wiring board is realized, for example, by an active matrix substrate member. The signal wirings of the substrate member is provided with a high frequency signal of which the polarity of voltage is inverted in a cycle longer than the time constant of the signal wirings, and the scanning wirings and common signal wirings for forming an auxiliary capacity are provided with a signal of which the absolute value of voltage is larger than that of the signal fed to the signal wirings. The voltage polarity of the signal fed to the signal wirings is positive. The voltage polarity of the signal fed to the common signal wirings is negative. Accordingly, much charging and discharging current flows in the wirings and electrodes, and the contrast of the infrared image varies significantly due to a tiny defect or the like. Hence, a tiny defect of a surface of the substrate member can be detected, and the precision of defect detection can be enhanced.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Now referring to the drawings, preferred embodiments of the invention are described below.

Figure 1:
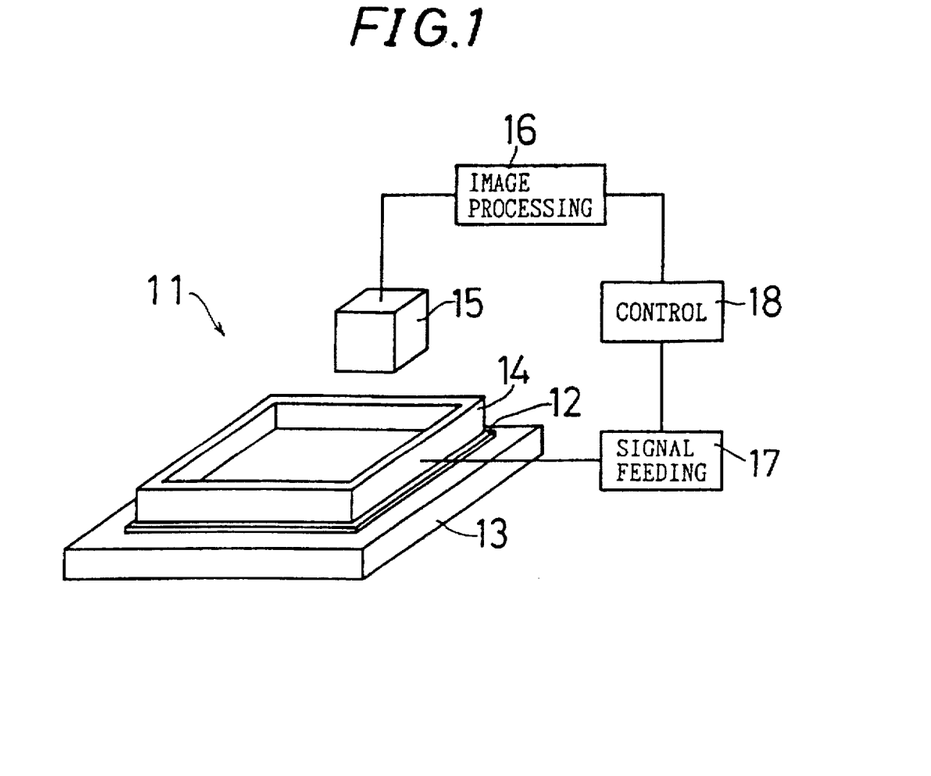
FIG. 1 is a simplified structural diagram of an apparatus for inspecting a wiring board of an embodiment of the invention.

FIG. 1 is a simplified structural diagram of a wiring board inspection apparatus 11 of an embodiment of the invention. A substrate member 12 to be inspected is put on a table 13, and then a frame 14 is put on the substrate member. In the bottom of the frame 14 (the contacting surface with the substrate member 12), plural terminals connected to signal feeding means 17 are provided, and this signal feeding means 17 feeds an inspection signal described later. The terminals of the frame 14 are pressed to contact the terminals of plural wirings described below provided around the substrate member 12. A predetermined inspection signal is fed to the wirings from the signal feeding means 17 through the terminals of the frame 14.

Above the table 13 is installed image pickup means 15, which picks up an infrared image of the substrate 12 under the state that the inspection signal is applied. The image pickup means 15 is realized by, for example, an infrared camera for forming an infrared image by capturing infrared rays radiated from a surface of the substrate member 12. The image data of the infrared image picked up by the image pickup means 15 are fed to image processing means 16 through, for example, an analog-to-digital converting circuit.

Figure 2A:
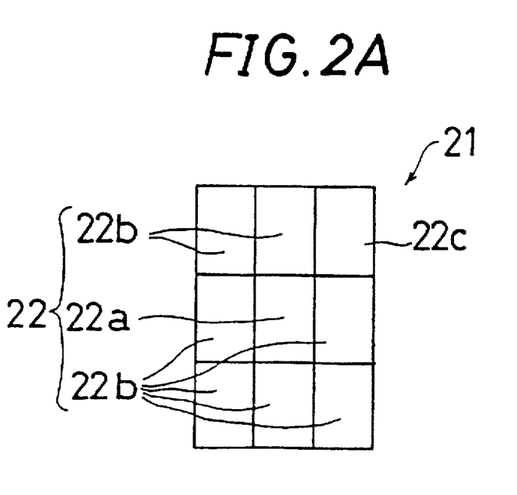
FIGS. 2A and 2B are diagrams showing an infrared image of a substrate member 12 processed by image processing means 16 in FIG. 1, FIG. 2A being a diagram showing an infrared image 21 divided into regions of a predetermined size, FIG. 2B being a diagram showing an infrared image in a region positioned in the center of the substrate member 12.
Figure 2B:
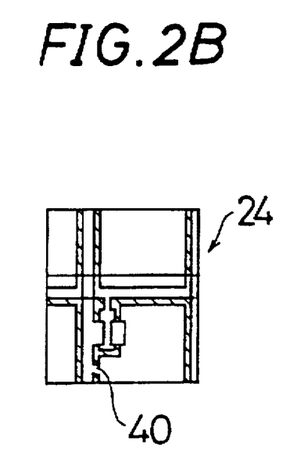

In the image processing means 16, on the basis of the image data, the image contrast is determined according to the amount of the infrared rays released from the substrate member 12. For instance, an infrared image 21 of a gray scale image with 256 gradations is formed. For instance, the image is formed so that the color of the image comes closer to white as the emission of the infrared ray released from an arbitrary point of the surface of the substrate member 12 increases. In succession, the image 21 is divided into regions 22 of a predetermined size as shown in FIG. 2A. The size of the regions 22 is determined so that an identical pattern may be formed in each region if there is no defect, on the basis of the pitch of repeating a pattern of wiring formed in the substrate member 12. The size of one region 22 is set, for example, to be the same as the size of one pixel. FIG. 2B shows an infrared image of region 22a, which is the central region of the substrate member 12. The shaded area shows the portion different in contrast from the white area (not shaded). The image processed by the image processing means 18 is given to control means 18.

In the control means 18, the image of an arbitrary region is compared with images of plural regions adjacent to the arbitrary region to detect a difference in image pattern. The central region 22a, for example, is compared with eight surrounding regions 22b, 22c. If there is a difference in image pattern, it is judged that there is a defect in the wiring of the picked-up image. The control means 18 is composed of detection means and judging means.

Figure 3:
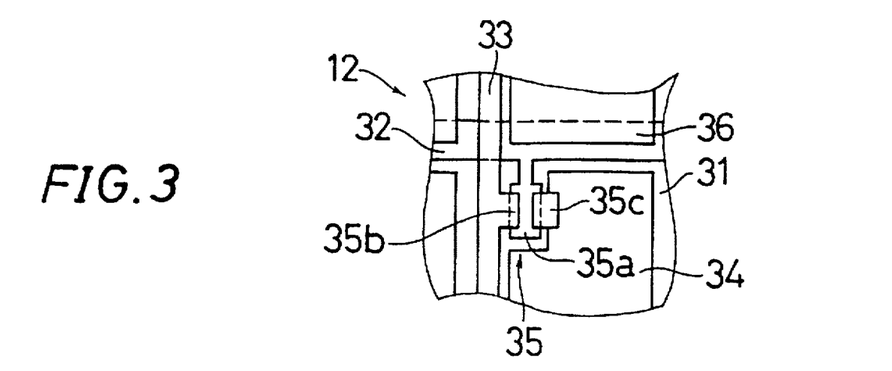
FIG. 3 is a partial plan view of the substrate member 12 in FIG. 1.

The substrate member 12 is realized by, for example, an active matrix substrate member using TFTs as switching elements shown in FIG. 3. This substrate member 12 is formed on an insulating substrate 31, by including plural scanning wirings 32, source signal wirings 33, pixel electrodes 34, and TFTs 35. The plural scanning wirings 32 are provided parallel to each other at an interval, and are connected to gate electrodes 35a of the TFTs 35. The source signal wirings 33 are provided parallel to each other at intervals, being orthogonal to the scanning wirings 32, and are connected to source electrodes 35b of the TFTs 35. The pixel electrodes 34 are provided in rectangular pixel regions enclosed by the scanning wirings 32 and the source signal wirings 33, and connected to drain electrodes 35c of TFTs 35. Accordingly, the pixel electrodes 34 are connected the wirings 32, 33 through the TFTs 35. On the scanning wirings 32, auxiliary capacity electrodes as part of the pixel electrodes 34 are superposed through an insulator, and auxiliary capacities 36 are formed between the scanning wirings 32 and the auxiliary capacity electrodes.

Figure 4:
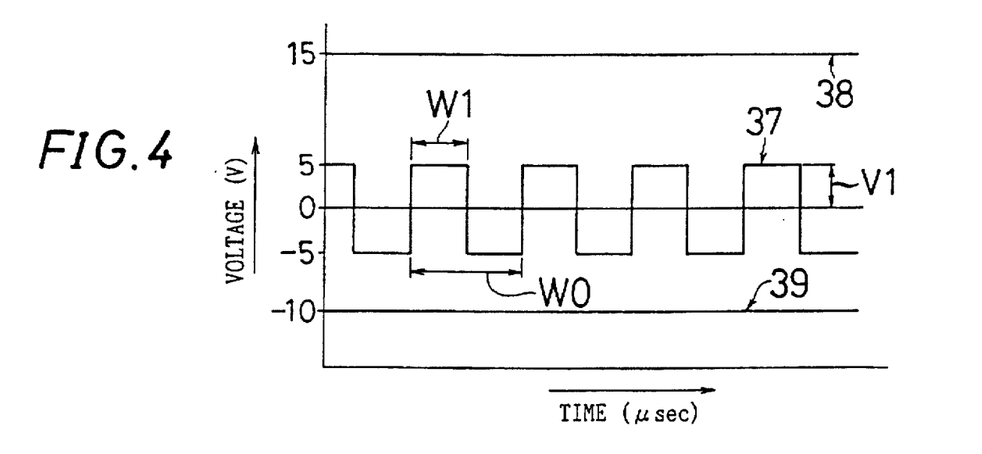
FIG. 4 is a waveform diagram showing an inspection signal fed to wirings of the substrate member 12 from signal feeding means 17 in FIG. 1.

To the source signal wiring 33, a source signal of rectangular wave is applied as indicated by a continuous line 37 in FIG. 4. The source signal is a signal of which the polarity of voltage is inverted in every period W1 which is half of the period W0 of the source signal. The period W1 is selected to be a value larger than the time constant of the source signal wirings 33. The time constant is determined by multiplying the resistance value of the source signal wiring 33 and the parasitic capacity of the source signal wiring 33. The parasitic capacity of the source signal wiring 33 is, for example, the sum of the capacities occurring at the intersecting positions of the source signal wiring 33 and the scanning wiring 32, and the capacities possessed by the TFTs 35 connected to the source signal wirings 33. The parasitic capacity can be preliminarily calculated from the structure of the substrate member 12.

By setting the period W1 larger than the time constant of the source signal wirings 33, the source signal can be transmitted without being rounded. For example, when the resistance value of the source signal wiring 33 is 50 kΩ and the parasitic capacity is 80 pF, the time constant is 4.0 μsec. In this case, the period of the source signal, for example, twice the period W1 is selected at 60 μsec. The voltage amplitude V1 of the source signal is set at a value closer to the driving voltage of the liquid crystal display apparatus. For example, the voltage amplitude V1 of the source signal is 5 V.

To the scanning wirings 32, a scanning signal of a constant voltage shown by a continuous line 38 in FIG. 4 is applied. The scanning signal is a signal of which the voltage absolute value is larger than the voltage amplitude V1 of the source signal and of which the voltage polarity is, for example, positive, that is a signal for putting the TFTs 35 into ON state. The voltage value of the scanning signal is set at a value close to the driving voltage of the liquid crystal display apparatus. For example, a stationary signal with a voltage of 15 V is applied as the scanning signal.

In this way, by applying a stationary signal to the scanning wirings 32, and applying a high frequency signal to the source signal wirings 33, a charging and discharging current flows in the source signal wirings 33. If there is a short circuit between the scanning wiring 32 and the source signal wiring 33, a potential difference is caused between the scanning wiring 32 and the source signal wiring 33 due to the voltage of each signal applied preliminarily, and therefore the current flows into the short-circuit spot, and Joule heat is generated. Besides, the TFTs 35 are in ON state, and hence a high frequency signal is put in the pixel electrode 34. Therefore, if there is a short circuit between the pixel electrode 34 and the wiring 32 or 33, similarly Joule heat is generated in the short-circuit spot. Therefore, in the infrared image of the region 22 including the wiring having a defect, the short-circuit spot looks white as indicated by reference numeral 40 in FIG. 2A.

The short-circuit spot generates heat, and emits intense infrared rays as compared with normal portions, and therefore the image of the region where a short circuit is caused and the images of plural adjacent surrounding regions are compared. For example, in the case of a corner region 22c in FIG. 2, the corner region is compared with three adjacent regions, and in the case of the central region 22a, the central region is compared with at most eight surrounding regions. In plural adjacent regions, it is hardly possible that all the adjacent regions have a defect at the same position, and therefore the contrast of the short-circuit spot differs between two images, and the image patterns vary. Therefore, by detecting the difference in image pattern, the short circuit formed in the region can be detected.

In the case where there is a disconnection in the source signal wiring 33, a source signal is not applied to the portion of the source signal wiring downstream from the disconnection portion in the signal transmission direction. Therefore, the portion of the source signal wiring downstream from the disconnection portion in the signal transmission direction does not generate infrared rays attributable to the charging and discharging current. Therefore, the images of the regions including the portion of the source signal wiring downstream from the disconnection portion in the signal transmission direction are different in contrast from the images of adjacent regions of a portion of a disconnection-free source signal wiring, and the image patterns vary. By detecting the difference in image pattern, the disconnection point can be detected. When detecting the disconnection of scanning wirings, a signal similar to the source signal is applied to the scanning wirings and image comparison can be similarly carried out.

Moreover, a source signal is applied to a TFT 35 under ON state. The charging and discharging current is also flowing in the TFT 35, and Joule heat is generated. In the case where due to malfunction of the TFT 35, for example, the TFT 35 remains under OFF state although it should be under ON state, the infrared images including this TFT 35 is different in the contrast of the TFT 35 portion, as compared with the images of a normal TFT 35. By detecting this difference in contrast, malfunction of the TFT 35 can be detected.

In this way, by comparing the infrared images of the regions including a wiring having a short circuit, a disconnection or malfunction of TFT 35, with the infrared images of other plural adjacent regions, and detecting a difference in image pattern or contrast, a defect caused in the pixels of the substrate member 12 can be detected.

Figure 5:
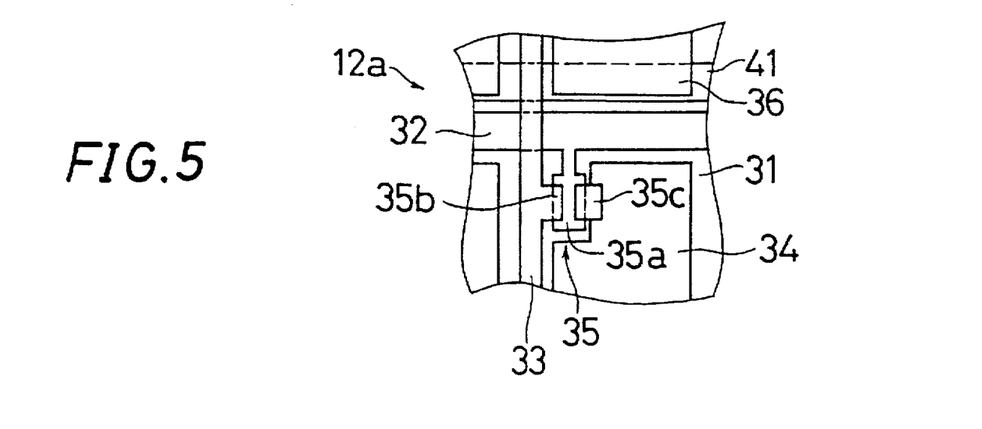
FIG. 5 is a partial plan view showing a substrate member 12a of other example of the substrate member 12 in FIG. 1.

As another example of the substrate member 12, an active matrix substrate member shown in FIG. 5 may be used. The substrate member 12a in FIG. 5 is similar in structure to the substrate member 12 in FIG. 3, and the same components are identified with the same reference numerals and explanations are omitted. In this example, the auxiliary capacity electrode which is a part of the pixel electrode 34 is superposed on the common signal wiring disposed parallel to the scanning wiring 32 through an insulator, and an auxiliary capacity 36 is formed. When inspecting this substrate member 12a by the inspection apparatus of FIG. 1, by applying a common signal as an inspection signal to the common signal wirings 41, aside from the scanning wirings 32 and the source signal wirings 33, the defect can be detected similarly to this embodiment. The common signal is selected so that the voltage absolute value be greater than the voltage amplitude V1 of the source signal, and that the voltage polarity may be negative, as indicated by a continuous line 39 in FIG. 4. For example, as the common signal, a stationary signal of a voltage of −10 V is applied.

Thus, in this embodiment, a defect is detected by comparing the contrast at a certain position of the image of a region with the contrasts at the same position of the images of other regions. If the degree of the defect is small and the current concentration is slight, the emission of infrared rays varies significantly depending on the slight change of resistance, as compared with the inspection apparatus of the prior art. As a result, a portion differing in contrast from the surrounding is formed in the image. At the same position of a reference image, such a different portion in contrast is not formed, and therefore by comparing the two images, this portion is detected as a different point in image pattern. In the prior art, since the images to be compared with each other are images of the same region, a different portion in contrast is formed in both images. Therefore, if the difference in contrast from the surrounding is small, it is hard to detect the difference between the two images. Hence, as compared with the prior art, the sensitivity to a delicate change of current concentration on the surface of the substrate member 12 is sufficiently obtained. Therefore, the precision of defect detection can be enhanced.

In the embodiment, moreover, a large charging and discharging current flows by applying a high frequency signal to wirings of at least one type of the plural types. Since the Joule heat increases in proportion to the resistance and the square of the current, the emission of the infrared rays emitted from the current flowing portion is larger than in the prior art. Hence, the difference in contrast of the picked-up infrared image is large, and the entire image becomes clear. Besides, depending on slight changes of resistance or the like, the contrast changes significantly, so that a defect can be detected more sensibly.

Also in the embodiment, for example, when comparing a region to be inspected and eight regions adjacent to the region to be inspected, such a case may be considered that there is one defect in the region to be inspected and additionally there is a different defect in one adjacent region to the region to be inspected. In this case, when the region to be inspected is compared with a normal adjacent region, only one difference is found. On the other hand, when the region to be inspected is compared with the region including a defect, two differences are found. Accordingly, the ratio of the combination of two images in which two differences are found is ⅛, and the ratio of the combination of two images in which only one difference is found is ⅞. When judging the existence of a defect from the existence of a difference in image pattern, by calculating the ratio of combinations of different images, it is also possible to judge whether a defect is present also in adjacent regions.

On the other hand, ignoring such a result that the region to be inspected has a difference from the surrounding regions and there are combinations of images differing in number of different points in the images of the surrounding regions, it is also possible to judge only whether a defect is present or not.

Figure 6:
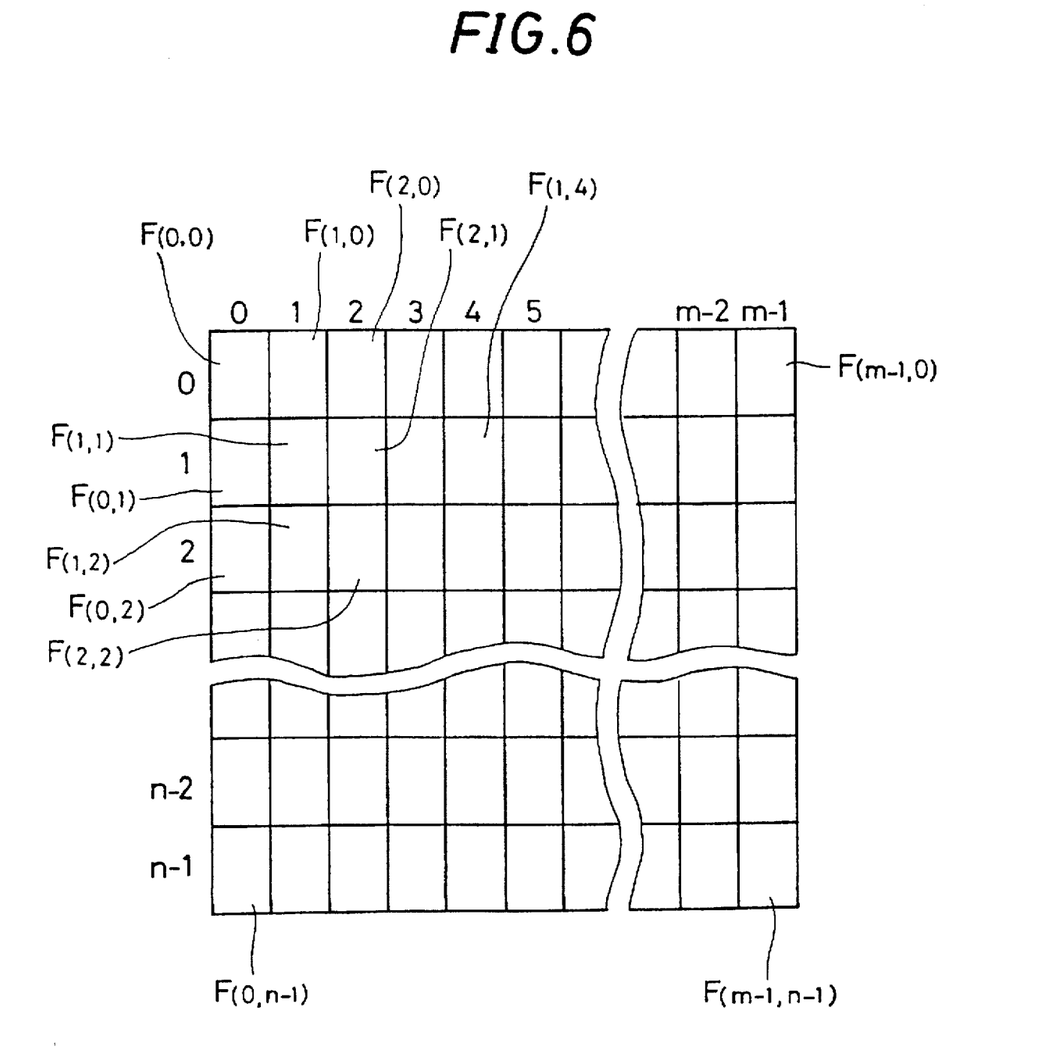
FIG. 6 is a diagram showing an infrared image of the substrate member 12 divided into (m×n) regions.
Figure 7:
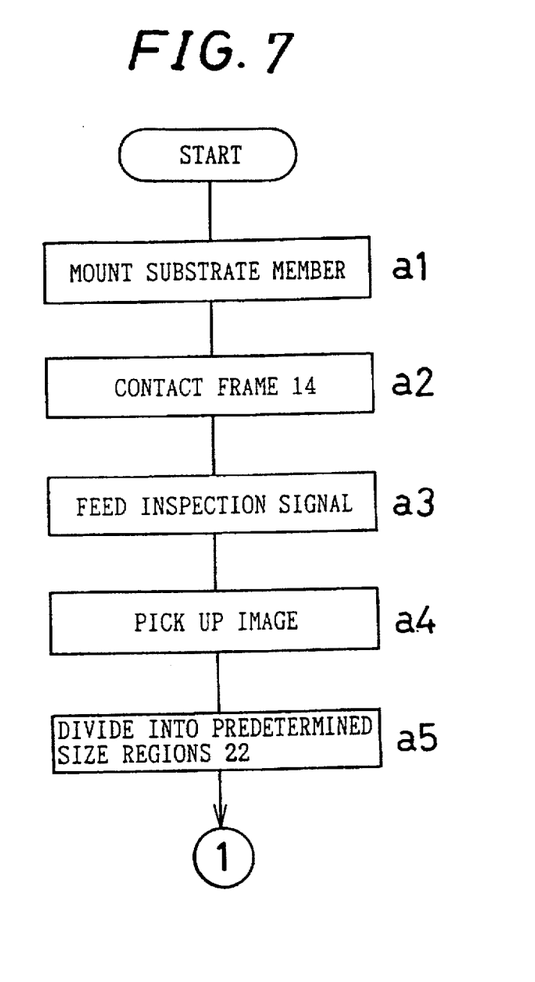
FIG. 7 is a flowchart showing the operation for detecting a defect of the substrate member 12 by control means 18.
Figure 8:
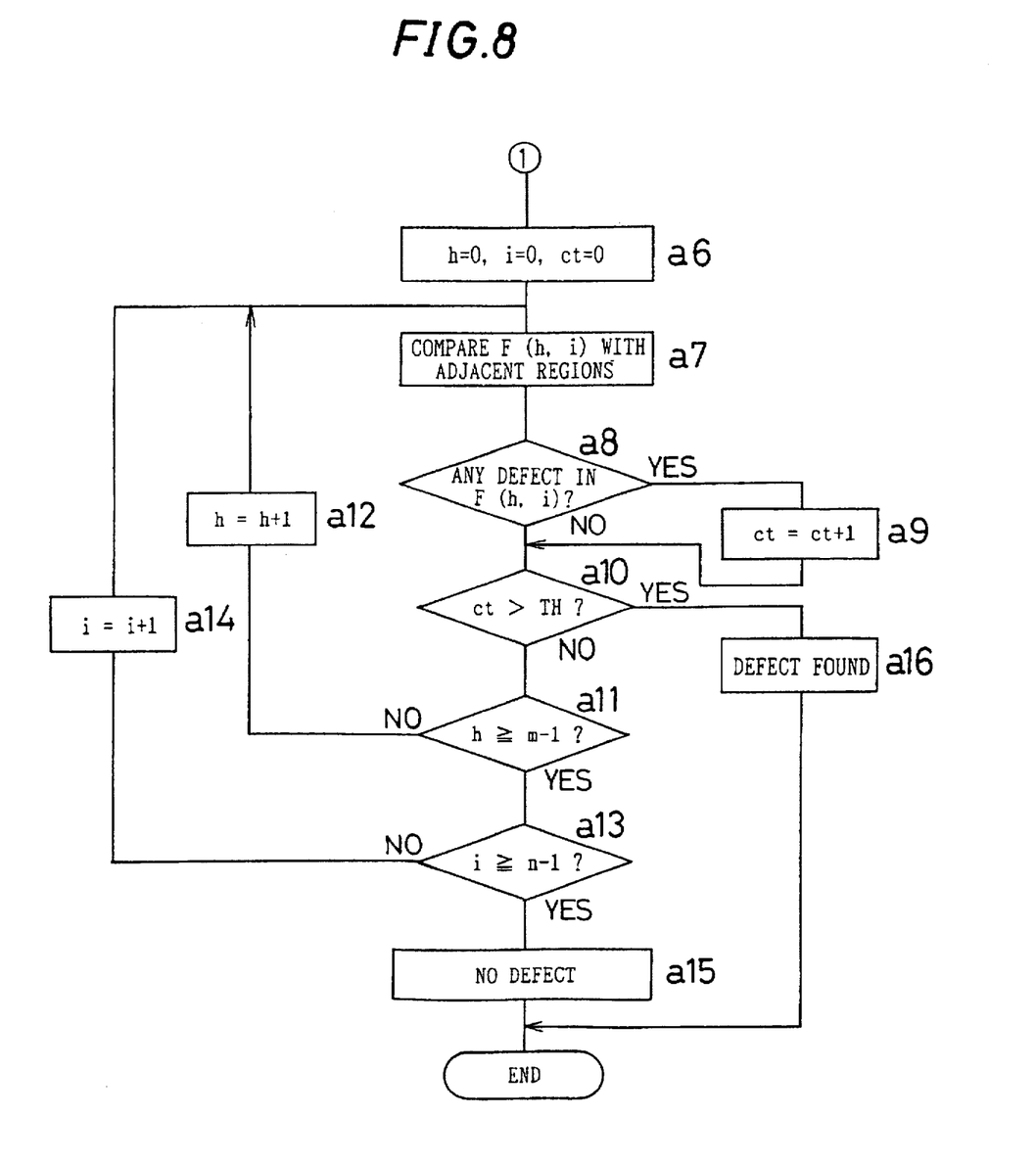
FIG. 8 is a flowchart showing the operation for detecting a defect of the substrate member 12 by control means 18.

FIG. 6 is a diagram showing an infrared image of a substrate member divided into (m×n) regions, and FIG. 7 and FIG. 8 are flowcharts showing the operation of detecting a defect of the substrate member by control means 18. For example, an active matrix substrate member used in a liquid crystal display apparatus or the like contains about 384×240 pixels in a display screen of about 3 inches in diagonal size. Accordingly, in actual inspection, substrates having (m×n) pixel electrodes are often inspected.

For example, let us suppose that a substrate member is divided into (m×n) regions F (0, 0) to F (m−1, n−1), and the wiring pattern in each region is composed equally to each other. Hence, when an infrared image of this substrate member is divided similarly into (m×n) regions F (0, 0) to F (m−1, n−1), the divided images are basically equal to each other.

At step a1, the substrate member 12 is put on the table 13. At step a2, the frame is put from above to electrically contacts the substrate member 12 put on the table 13. At step a3, an inspection signal is supplied from the signal feeding means 17 to the frame 14. At step a4, the infrared image of the substrate member 12 put on the table 13 is taken by the image pickup means 15. At step a5, the taken infrared image is divided into (m×n) regions F (0, 0) to F (m−1, n−1) of a predetermined size as shown in FIG. 6.

At step a6, the values of variables h and i used for specifying the positions of the predetermined regions F (0, 0) to F (m−1, n−1) are set at 0, and the value of variable ct for counting the regions having a defect is set at 0. At step a7, the infrared image of the region F (h, i) specified by the values of variables h and i among the (m×n) predetermined regions F (0, 0) to F (m−1, n−1), and the infrared images of three to eight adjacent regions are compared. For example, regions adjacent to the specified region F (0, 0) are three regions, F (1, 0), F (1, 1),and F (0, 1), and by comparing the infrared image of the region F (0, 0) with the infrared images of the three regions, F (1, 0), F (1, 1),and F (0, 1), whether a difference in gradation is present or not is investigated. Depending on the position of the specified region, the number of adjacent regions mainly changes to three, five or eight.

At step a8, it is judged whether a defect is present in the region F (h, i) specified on the basis of the result of comparison at step a7. The operation advances to step a9 if present, or step a10 if not present. At step a9, "1" is added to the variable ct indicating the number of regions having a defect, and thereby the operation goes to step a10. At step a10, it is judged if the variable ct indicating the number of regions having a defect is larger than the threshold TH. The operation goes to step a16 if larger, and to step a11 if not.

At step a11, it is judged whether the variable h has exceeded m−1 or not. The operation goes to step a13 if m−1 or more, and to step a12 if less than m−1. At step a12, "1" is added to the variable h to return to step a7. At step a13, it is judged whether the variable i is n−1 or more. The operation goes to step a15 if n−1 or more, and to step a14 if less than n−1. At step a14, "1" is added to the variable i, thereby returning to step a7. At step a15, the substrate member is judged to be free from defect. At step a16, the substrate member is judged to have a defect.

When inspecting a substrate member in which the wiring pattern is the same in all regions when visually divided into (m×n) regions, the picked up infrared image is also divided similarly. To judge whether a defect is present or not in the substrate member, the divided regions F (0, 0) to F (m−1, n−1) are individually compared with the adjacent regions to detect the difference, and whether a defect is present in the regions is detected by the difference, and when a defect is detected in more regions than a predetermined threshold, for example, three, it is judged that the substrate member is defective. Therefore, since whether a defect is present or not is judged in each divided region of the same size as, for example, one pixel, the position of the defect can be known accurately.

Figure 9:
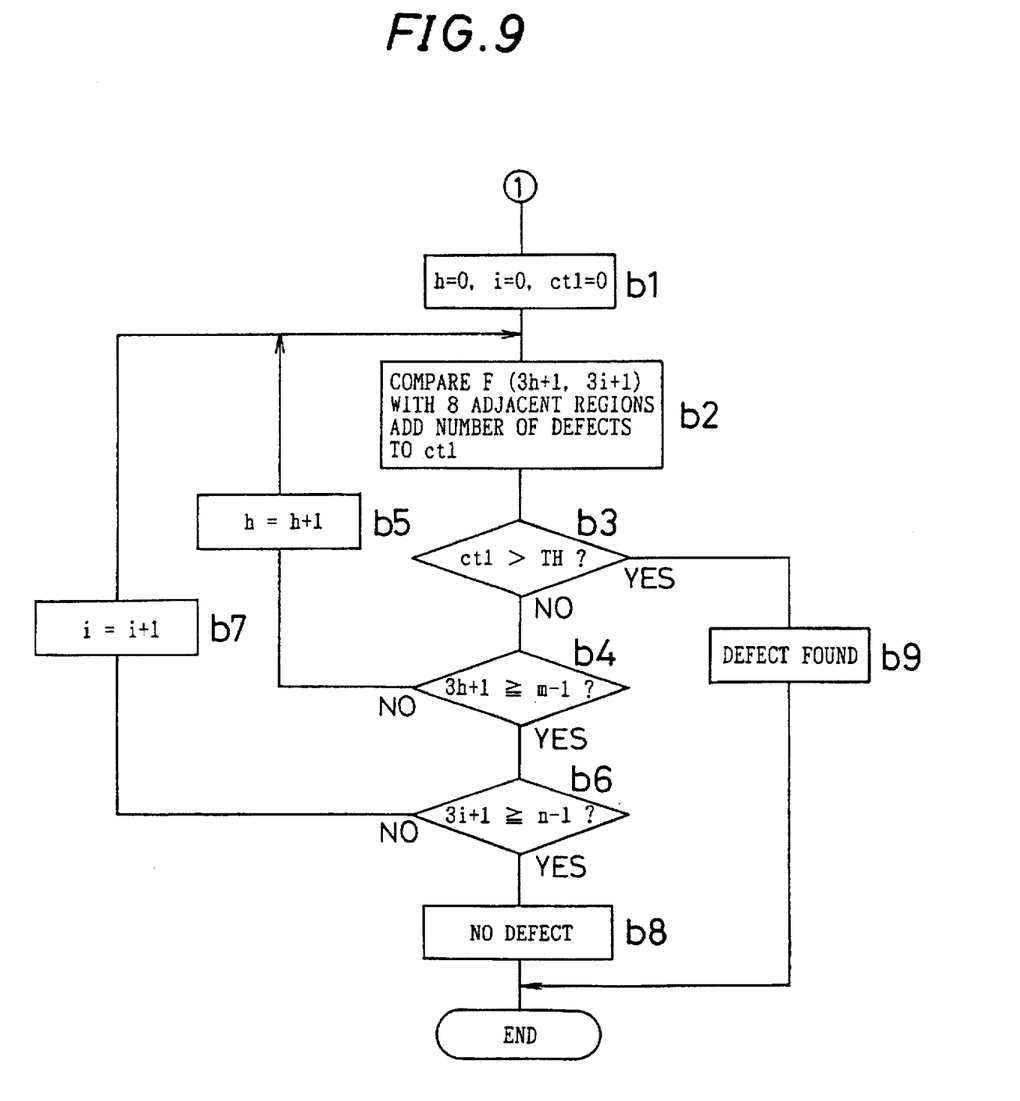
FIG. 9 is a flowchart explaining other embodiment.

FIG. 9 is a flowchart for explaining another embodiment. The operations from mounting the substrate member 12 on the table 13, through picking up an infrared image of the substrate member 12 by the image pickup means 15 to dividing the picked-up infrared image into predetermined size regions F (0, 0) to F (m−1, n−1) are the same as the operations shown in FIG. 7. The subsequent processing is as follows.

At step b1, the values of variables h and i used for determining the positions of the divided regions F (0, 0) to F (m−1, n−1) are set at 0, and the value of the variable ct1 for counting the regions having defects is set at 0.

At step b2, the infrared image of the region F (3h+1, 3i+1) specified by the values of the variables h, i in (m×m) regions F (0, 0) to F (m−1, n−1) and the infrared images of the eight adjacent regions are compared, and by detection of difference between the infrared images, the regions having a defect out of nine regions are detected, and the number of regions having a defect is added to ct1. For example, on the basis of the infrared image of the specified region F (1, 1), the infrared images of eight adjacent regions F (0, 0), F (1, 0), F (2, 0), F (2, 1), F (2, 3), F (1, 2), F (0, 2), F (0, 1) are compared, and whether a difference is present or not is detected. To detect regions having a defect, regions having a defect are detected using number of differences and the ratio of the combinations of two images in which the number of differences are found to eight combinations in all. If the ratio of the combinations of two images in which zero difference is found is 6/8, and the ratio of the combinations of two images in which one difference is found is 2/8, it is detected that a defect is present in two regions out of nine regions.

At step b3, it is judged whether the number of regions having a defect is larger than the threshold TH or not. The operation goes to step b9 if larger, and to step b4 otherwise.

At step b4, it is judged whether the variable 3h+1 has exceeded m−1 or not. The operation goes to step b6 if m−1 or more, and to step b5 if less than m−1. At step b5, "1" is added to the variable h, thereby return to step b2. At step b6, it is judged whether the variable 3i+1 is n−1 or more. The operation goes to step b8 if n−1 or more, and to stop b7 if less than n−1. At step b7, "1" is added to the variable i, thereby returning to step b2. At step b8, the substrate member is judged to be free from defects. At step b9, the substrate member is judged to have a defect.

When inspecting a substrate member in which the wiring pattern is the same in all regions when visually divided into (m×n) regions, the picked infrared image is also divided similarly. To detect regions having a defect, an image group composed of nine regions of 3×3 is extracted from the divided regions F (0, 0) to F (m−1, n−1), and, for example, the infrared image of the central region is selected as a reference, and is compared with infrared images of eight other regions adjacent to the central region, a difference is detected, and regions having a defect are detected using number of differences and the ratio of a combination of two images in which the number of differences are found. Therefore, whether a defect is present or not is judged in each image group composed of nine regions, so that the substrate member can be inspected at high speed.

Additionally it is possible to identify the regions having a defect using such a ratio only. For example, if the ratio of combinations of two images in which no defect is found to eight combinations in all is ⅞, it is assumed that one of the other eight regions and/or the reference region has a defect.

The invention may be also preferably applied in the inspection for detection of defects on an active matrix substrate member using two-terminal elements such as MIM (metal-insulator-metal) elements as switching elements. It may be further applied to the inspection for detection of defects on a general wiring board repeating a wiring pattern such as memory elements.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. An inspection apparatus for a wiring board in which wirings are formed by repeating a wiring pattern, the apparatus comprising:

a table for receiving a wiring board to be inspected;

a signal feeding means for feeding an inspection signal to each wiring of the wiring board;

imaging means for capturing an infrared image of the wiring board;

image processing means for responding to an output of the imaging means and dividing the infrared image into regions of the wiring board of a predetermined size;

detection means for responding to an output of the image processing means, comparing an infrared image of a first arbitrary region of the wiring board to adjacent arbitrary regions of the wiring board, and detecting a difference between the compared regions; and judging means for responding to an output of the detection means and judging whether a defect is present in the first arbitrary region of the wiring board.

2. The inspection apparatus of claim 1, wherein the wiring board comprises:

plural scanning wirings disposed parallel to each other at intervals on an insulating substrate;

plural signal wirings disposed at intervals orthogonally to the scanning wirings;

pixel electrodes disposed in rectangular pixel regions formed by intersection of the scanning wirings and signal wirings; and switching elements disposed in the pixel electrodes for connecting the wirings with pixel electrodes.

3. The inspection apparatus of claim 2, wherein the signal feeding means provides the signal wirings with a signal of which the voltage polarity is repeatedly inverted in a cycle, each inversion following a period of time longer than a time constant of the product of the parasitic capacity and the resistance of the signal wirings, and provides the scanning wirings with a signal of which the voltage polarity is always positive, and of which the voltage absolute value is larger than the voltage amplitude of the signal fed to the signal wirings.

4. The inspection apparatus of claim 2, wherein the wiring board comprises common signal wirings disposed parallel to the scanning wirings, and auxiliary capacity electrodes disposed on the common signal wirings through an insulating layer, and connected to the pixel electrodes respectively, and the signal feeding means provides the signal wirings with a signal of which the voltage polarity is repeatedly inverted in a cycle, each inversion following a period of time longer than a time constant of the product of the parasitic capacity and the resistance of the signal wirings, provides the scanning wirings with a signal of which the voltage absolute value is larger than the voltage amplitude of the signal fed to the signal wirings, and of which the voltage polarity is always positive, and provides the common signal wirings with a signal of which the voltage absolute value is larger than the voltage amplitude of the signal fed to the signal wirings, and of which the voltage polarity is always negative.

5. The inspection apparatus of claim 2, wherein the image processing means defines each region of a predetermined size as a rectangular region including at least one pixel electrode, and divides the picked-up infrared image so that the rectangular regions may be arranged in a matrix form.

6. The inspection apparatus of claim 5, wherein the detection means responds to an output of the image processing means, compares the infrared image of each region with infrared images of plural adjacent regions, and detects differences among the infrared images of the respective regions, and the judging means responds to an output of the detection means, judges whether a defect is present or not in each region, counts the number of regions having a defect, compares the counted value with a predetermined threshold, and judges whether the wiring board is acceptable or not.

7. The inspection apparatus of claim 5, wherein the detection means responds to an output of the image processing means, extracts infrared images in units of an image group composed of infrared images of a predetermined number of regions, compares the infrared image of one reference region in each image group with the infrared images of the other regions in each image group, and detects a difference between the infrared images, and the judging means responds to an output of the detection means, judges whether a defect is present or not in each image group, counts the number of regions having a defect in each image group, adds all the counted values, compares the total of the counted values with a predetermined threshold, and judges whether the substrate member is acceptable or not.

8. A wiring board inspection device comprising:

a table adapted to receive wiring boards having a repeating wiring pattern of wirings;

an inspection signal source coupled to wiring of the wiring board on the table and said inspection signal source generating a hot spot at a short circuit on the wiring board;

an infrared image sensor proximate the table and positioned to sense an infrared image of the wiring pattern of the wiring board and generate an output signal indicative of the infrared image of the wiring pattern;

an image processor and comparator receiving the output signal from the sensor, and comparing first and second regions of the infrared image of the wiring pattern to detect the hot spot, and generating a wiring difference signal if the first and second regions do not match.

9. A method for inspecting liquid crystal display wiring boards, each having source signal wiring and scanning wiring, the method comprising the following steps:

a. applying a high-frequency signal to the source signal wirings, and a consistently positive voltage signal to the scanning wirings;

b. allowing Joule heat to be emitted from any short circuit between the source signal wiring and scanning wiring, wherein the Joule heat emission from the short circuit is greater in intensity than heat emissions from other portions of the wiring board;

c. capturing an infrared image of the wiring board with an infrared sensor, wherein the Joule heat emissions from the short circuit are detectable in the infrared image;

d. comparing regions of the infrared image of the wiring board to other regions of the wiring board, and e. identifying differences between the compared regions to detect the Joule heat emissions indicative of the short circuit in the wiring board.

* * * * *